(12) United States Patent
Ikefuji et al.

(10) Patent No.: US 6,404,644 B1
(45) Date of Patent: Jun. 11, 2002

(54) NON-CONTACT IC CARD

(75) Inventors: Yoshihiro Ikefuji; Hiroharu Okada, both of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/462,069

(22) PCT Filed: Jun. 8, 1998

(86) PCT No.: PCT/JP98/02540

§ 371 (c)(1),
(2), (4) Date: Jan. 5, 2000

(87) PCT Pub. No.: WO99/03062

PCT Pub. Date: Jan. 21, 1999

(30) Foreign Application Priority Data

Jul. 10, 1997 (JP) .............................. 9-184702

(51) Int. Cl.[7] .............................. H05K 1/11; H05K 1/14
(52) U.S. Cl. ..................... 361/737; 361/803; 361/820; 235/492; 257/679
(58) Field of Search ................ 361/728, 736, 361/737, 760, 763, 772, 803, 820; 257/679, 783, 780; 235/492

(56) References Cited

U.S. PATENT DOCUMENTS 5,705,852 A   1/1998   Orihara et al.
5,880,934 A * 3/1999   Haghiri-Tehrani .......... 361/737
6,180,434 B1 * 1/2001   Lange et al. ................ 438/106

FOREIGN PATENT DOCUMENTS

| DE | 44 10 732 A1 | 10/1995 |
| EP | 0737935 A2 | 10/1996 |
| JP | 63-232485 | 9/1988 |
| JP | 8-227447 | 9/1996 |
| JP | 8-287208 | 11/1996 |
| WO | WO 95/26538 | 10/1995 |

* cited by examiner

Primary Examiner—Jayprakash N. Gandhi
(74) Attorney, Agent, or Firm—Arent Fox Kintner Plotkin & Kahn, PLLC

(57) ABSTRACT

A non-contact IC card (1, 2, 30, 50) includes a substrate (10), a coil (12, 32, 52, 57) provided on substrate (10), and an IC chip (11, 31, 51) electrically connected to a coil (12, 32, 52, 57) and having a main surface (11c, 31c, 51e). IC chip has a terminal (11a, 11b, 31a, 31b, 51a, 51b, 51c, 51d) formed in main surface (11c, 31c, 51e). Coil (12, 32, 52, 57) has a coil inner end (12b, 32b, 52b, 57b) electrically connected to a terminal (11b, 31b, 51b, 51d) and a coil outer end (12a, 32a, 52a, 57a) electrically connected to a terminal (11a, 31a, 51a, 57c). IC chip (11, 31, 51) is provided above coil (12, 32, 52, 57) such that coil inner end (12b, 32b, 52b, 57b) is positioned in vicinity of terminal (11b, 31b, 51b, 51d) and coil outer end (12a, 32a, 52a, 57a) is positioned in vicinity of terminal (11a, 31a, 51a, 51c).

12 Claims, 6 Drawing Sheets

NON-CONTACT IC CARD

This application is a National Stage Application of International Application PCT/JP98/02540, with an international filing date of Jun. 8, 1998, the disclosure of which is incorporated into this application by reference.

TECHNICAL FIELD

The present invention generally relates to a non-contact IC card. More specifically, the present invention relates to a non-contact type IC card without a power supply source for transmission/reception of an electric signal to/from an external data processing apparatus by converting a radio wave received by a self-contained antenna coil to electric power.

BACKGROUND ART

A non-contact type IC card has been proposed and recently used which is provided with a semiconductor integrated circuit device (IC) for storing information (data) and transmits/receives information to/from an external data processing apparatus which utilizes or supplies the information in a non-contact state.

Such non-contact type IC card is used, for example, as a pass of the ski lift, a commuter's pass for a train or bus, a tag for administration of inventory and the like, in an information management system.

In the information management system using the non-contact IC card, information is transmitted by an electromagnetic wave (hereinafter referred to as an RF carrier). An external apparatus modulates the RF carrier and transmits a command or information. The IC card is provided with a tuning circuit including a coil as an antenna for receiving the modified RF carrier and a capacitor.

The IC card demodulates the modulated RF carrier transmitted by the external apparatus for obtaining the command or information and, changes an impedance of the tuning circuit by a signal representing information to be returned in a period during which RF carrier is not modulated. The change in the impedance modulates the RF carrier. The external apparatus receives and demodulates the modulated RF carrier to obtain information from the IC card.

Preferably, the IC card can semi-eternally be used and thin. Thus, the IC card receives electric power from the RF carrier rather than having a power supply source with a limited lifetime.

Transmission of information and supply of electric power can be performed by the same RF carrier. When transmission of information and supply of electric power are performed by the same RF carrier, one tuning circuit is provided in the IC card. When transmission of information and supply of electric power are performed by different RF carriers, two tuning circuits are provided in the IC card. FIGS. 7 and 8 are diagrams showing conventional IC cards.

Referring to FIG. 7, an IC card 100 is provided with an IC chip 111, one tuning circuit 114, and a capacitor 115 for storing (smoothing) electric power obtained by an RF carrier.

Tuning circuit 114 is connected to IC chip 111. Tuning circuit 114 has a coil 112 as an antenna for receiving the RF carrier, and a capacitor 113 for resonance connected in parallel with the coil. Capacitor 115 is also connected to IC chip 111.

In such IC card 100, information is transmitted and electric power is supplied from an external apparatus to tuning circuit 114 including a coil 112 and capacitor 113. The supplied electric power is stored in capacitor 115 through IC chip 111.

Referring to FIG. 8, an IC card 200 is provided with an IC chip 221, two tuning circuits 224 and 229 and a capacitor 225 for storing (smoothing) electric power obtained by an RF carrier. Tuning circuit 224 has a coil 222 as an antenna for receiving the RF carrier, and a capacitor 223 for resonance connected in parallel with coil 222. Tuning circuit 224 is supplied with electric power from an external apparatus by receiving the RF carrier.

Tuning circuit 229 has a coil 227 as an antenna for receiving the RF carrier, and a capacitor 228 for resonance connected in parallel with coil 227. Coil 227 of tuning circuit 229 receives the RF carrier for data transmission with respect to the external apparatus.

Tuning circuits 224 and 229 and capacitor 225 are connected to IC chip 221. When tuning circuit 224 is supplied with electric power from the external apparatus, the electric power is stored in capacitor 225 through IC chip 221.

FIG. 9 is a plan view showing the IC card in FIG. 7, and FIG. 10 is a cross sectional view taken along the line B—B in FIG. 9. Referring to FIGS. 9 and 10, IC card 100 is provided with a substrate 110, a coil 112, an IC chip 111 as a semiconductor device and capacitors 113 and 115. Coil 112 of a conductor is formed on substrate 110. Coil 112 has a coil outer end 112a and a coil inner end 112b.

IC chip 111 as a semiconductor device is formed above substrate 110. IC chip 111 has a main surface 111c facing substrate 110. Main surface 111c has terminals 111a and 111b. Terminal 111a is electrically connected to coil outer end 112a. Terminal 111b is electrically connected to a coil inner end 112b which is on the inner side 112c of the coil by an interconnection 153 via through holes 151 and 152 formed in substrate 110.

IC chip 111 is electrically connected to capacitors 113 and 115 which are on the outer side 112d of the coil by an interconnection 157. A thin plate of resin (not shown) is formed on substrate 110 to cover coil 112, IC chip 111, capacitors 113 and 115 and the like. It is noted that inner or outer ends of two coils 222 and 227 are connected to a terminal of IC chip 221 via a through hole formed in the substrate and a back surface of the substrate also in IC card 220 having two tuning circuits 224 and 229 shown in FIG. 8.

In IC card 100 having the above described structure, terminal 111b and coil inner end 112b are electrically connected by interconnection 153 via through holes 151 and 152. Thus, interconnection 153 is not brought into contact with coil 112 except at coil outer end 112b or with capacitors 113 and 115. Therefore, a problem associated with a short-circuit is prevented.

However, such IC card 100 requires a step of forming through holes 151 and 152 and a step of forming interconnection 153 on the surface opposite to that at which coil 112 and IC chip 111 are formed. Further, a step of filling through holes 151 and 152 with metal for interconnection by vapor deposition is required. This makes a manufacturing process complicated and undesirable in terms of efficiency and cost.

As IC card 100 is thin and flexible, interconnection 153 is likely to be broken in through holes 151 and 152, thereby causing malfunction.

It is noted that although IC chip 111 is provided on the outer side 112d of the coil in IC card 100 shown in FIG. 9, IC chip 111 may be provided on the inner side 112c of the coil. However, also in this case, a through hole must be formed to electrically connect coil outer end 112a and terminal 111a of IC chip 111. As a result, the problem associated with the complicated manufacturing process and malfunction is caused.

To solve these problems, main surface 111c of IC chip 111 with terminals 111a and 111b may be formed as an upside in FIG. 10, where terminals 111a and 111b are electrically connected to coil outer and inner ends 112a and 112b by bonding wires, respectively. Such structure eliminates the need for a through hole and the manufacturing process is not complicated.

However, the bonding wire electrically connecting terminal 111b and coil inner end 112b crosses over coil 112, and therefore the bonding wire may be brought into contact with coil 112 and causes malfunction. Further, as a length of the bonding wire connecting terminal 111b and coil inner end 112b is large, external force may break the wire to cause malfunction.

Therefore, the present invention is made to solve the aforementioned problems. An object of the present invention is to provide a non-contact IC card which can readily be manufactured and is capable of preventing malfunction.

DISCLOSURE OF THE INVENTION

A non-contact IC card according to the present invention is provided with a substrate, a conductive layer provided on the substrate to form a coil, and a semiconductor device electrically connected to the conductive layer and having a main surface. The semiconductor device has first and second terminals formed in the main surface. The conductive layer has a coil inner end electrically connected to the first terminal and a coil outer end electrically connected to the second terminal. The semiconductor device is formed above the conductive layer such that the coil inner end is positioned in vicinity of the first terminal and the coil outer end is positioned in vicinity of the second terminal.

In the non-contact IC card having the above described structure, as the coil inner end is positioned in vicinity of the first terminal and the coil outer end is positioned in vicinity of the second terminal, a contact hole is not required for electrically connecting the end of the coil and the terminal of the semiconductor device as in the conventional case. Thus, the manufacture is facilitated and breakage of a wire is prevented. In addition, as the coil inner end is positioned in vicinity of a first terminal and a coil outer end is positioned in vicinity of the second terminal, even when the terminal and the end are connected by a bonding wire, the length of the bonding wire is small. As a result, breakage of the wire and contact of the bonding wire with the coil are prevented. Therefore, a non-contact IC card capable of preventing malfunction is provided.

Preferably, the semiconductor device is provided above the conductive layer such that the first terminal is positioned above the coil inner end and the second terminal is positioned above the coil outer end. Preferably, the semiconductor device is positioned to cover a portion of the conductive layer.

Preferably, the main surface of the semiconductor device has first and second corners, where the first and second terminals are respectively formed at the first and second corners. In this case, the conductive layer of the coil can be formed between the first and second corners. Then, the number of turns of the coil increases and, even when an intensity of an RF carrier is low, a signal or electric power can surely be obtained by the RF carrier.

Preferably, the first and second corners are spaced by a distance on an imaginary diagonal line on the main surface.

In this case, the distance between the first and second corners is further increased so that the number of turns of the coil further increases.

The main surface of the semiconductor device with the first and second terminals may face the conductive layer. Preferably, the first terminal and the coil inner end are electrically connected by a solder and the second terminal and the coil outer end are also electrically connected by a solder. Preferably, each of the first and second terminals is in a bump shape. In this case, it is ensured that the first terminal and coil inner end are connected by a solder and the second terminal and the coil outer end are connected by a solder. As a result, the problem associated with breakage of the wire or short-circuit is not caused, so that malfunction is prevented.

The surface opposite to the main surface of the semiconductor device with the first and second terminals may face the conductive layer. Preferably, the first terminal and the coil inner end are electrically connected by a conducting line, and the second terminal and the coil outer end are electrically connected by the conducting line. In this case, it is ensured that the first terminal and the coil inner end are connected by the conducting line and the second terminal and the coil outer end are also connected by the conducting line. A length of the conducting line is smaller. As a result, the problem associated with connecting failure or short-circuit is not caused, so that malfunction is prevented.

Preferably, the semiconductor device and the coil inner end of the conductive layer are electrically connected by a composite material including an insulator in which a plurality of conductors are formed in one direction. The semiconductor device and the coil outer end of the conductive layer are electrically connected by the composite material.

Preferably, the non-contact IC card is provided above the substrate and further includes a capacitor connected to the semiconductor device.

Preferably, the conductive layer forms a plurality of coils.

BEST MODE FOR CARRYING OUT THE INVENTION

Now, the best mode for carrying out the invention will be described with reference to the drawings.

First Embodiment

Figure 1:
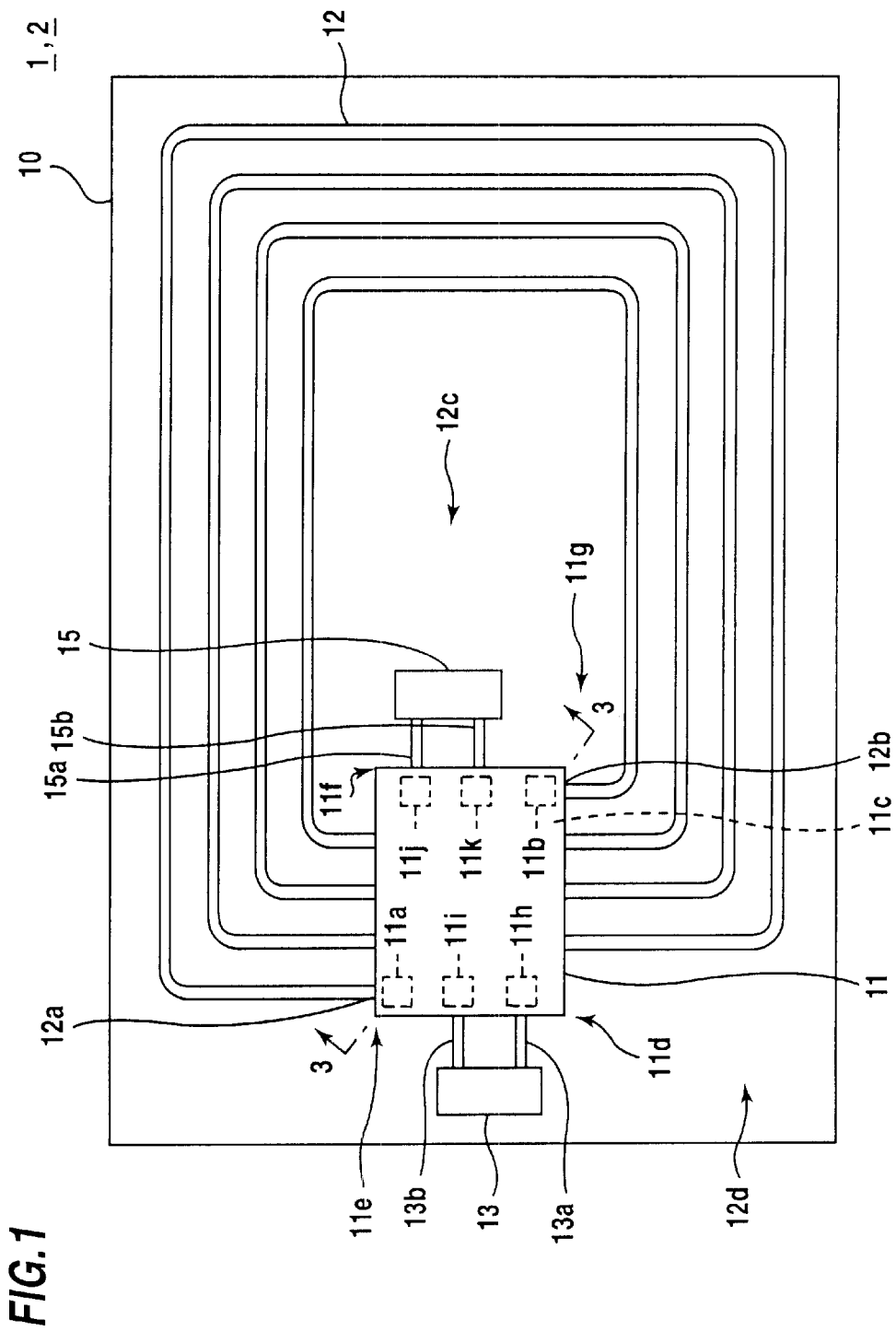
FIG. 1 is a plan view showing an IC card according to first and second embodiments of the present invention.

Referring to FIG. 1, in a non-contact IC card 1 according to the first embodiment of the present invention, one tuning circuit transmits information and receives electric power. IC card 1 is provided with a substrate 10, a non-contact IC chip 11 as a semiconductor device provided above substrate 10, a coil 12 provided on substrate 10 and electrically connected to IC chip 11, and capacitors 13 and 15 electrically connected to IC chip 11.

Substrate 10 is approximately rectangular in shape and a coil 12 including a spirally wound conductor is formed on substrate 10. Coil 12 serves as an antenna for receiving an RF carrier transmitted from an external apparatus. Coil 12 has a coil outer end 12a and a coil inner end 12b.

IC chip 11 is formed above substrate 10 and coil 12. IC chip 11 covers a portion of coil 12. IC chip 11 has a main surface 11c facing substrate 10. Main surface 11c has corners 11d, 11e, 11f and 11g. Corner 1 id as the first corner and corner 11e as the second corner are spaced by a distance on an imaginary diagonal line of main surface 11c.

A terminal 11b as the first terminal is formed at corner 11g. A terminal la as the second terminal is formed at corner 11e. Terminals 11h, 11i, 11j and 11k are formed in main surface 11c. IC chip 11 is positioned such that terminal 11a is positioned in vicinity of coil outer end 12a and terminal 11b is positioned in vicinity of coil inner end 12b. Terminal 11a and coil outer end 12a are electrically connected and terminal 11b and coil inner end 12b are electrically connected.

A capacitor 13 for resonance is provided on the outer side 12d of coil 12 to be electrically connected to terminals 11h and 11i of IC chip 11 by interconnections 13a and 13b. A capacitor 15 for storing (smoothing) electric power is formed on the inner side 12c of the coil to be electrically connected to terminals 11j and 11k of IC chip 11 by interconnections 15a and 15b.

Figure 2:
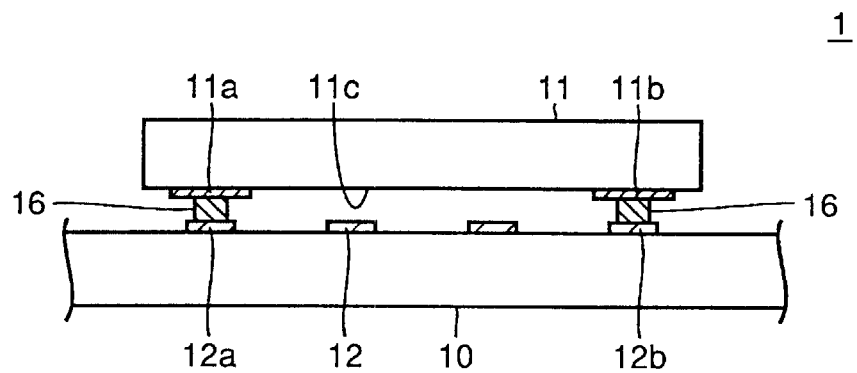
FIG. 2 is a cross sectional view taken along the line A—A of the IC card of the first embodiment shown in FIG. 1.

Referring to FIG. 2, coil 12 is provided on substrate 10, having coil outer end 12a and coil inner end 12b which are spaced by a distance. Coil outer end 12a is electrically connected to terminal 11a in a bump shape by a solder 16. Coil inner end 12b is connected to terminal 11b in a bump shape by solder 16. Terminals 11a and 11b are provided on IC chip 11. Accordingly, IC chip 11 is fixed to substrate 10 by solder 16.

Thus, IC chip 11 is fixed to substrate 10 by solder 16, and a space is formed between IC chip 11 and substrate 10, in which coil 12 is arranged. Consequently, IC chip 11 is prevented from being brought into contact with coil 12 other than coil outer end 12a and coil inner end 12b.

It is noted that, while not shown, metal bumps are also formed as terminals 11h, 11i, 11j and 11k of IC chip 11 connected to capacitors 13 and 15. These bumps are formed on substrate 10 and fixed to interconnections 13a, 13b, 15a and 15b connected to capacitors 13 and 15 by solders. Such IC chip 11, which is fixed to substrate 10 by bumps formed as terminals and having main surface 11c with the terminals facing substrate 10, is generally called a flip chip.

As is apparent from FIGS. 1 and 2, IC chip 1 having the above described structure does not have a contact hole. Thus, the manufacturing process is not complicated. Terminal 11a of IC chip 10 is provided in vicinity of coil outer end 11a and terminal 11b is provided in vicinity of coil inner end 12b. Terminal 11a and coil outer end 12a are electrically connected by a solder and terminal 11b and coil inner end 12b are also connected by a solder. As a result, as compared with the case where long bonding wires are used for connection, the problem associated with connecting failure or short-circuit is not caused, so that malfunction is prevented.

Second Embodiment

Figure 3:
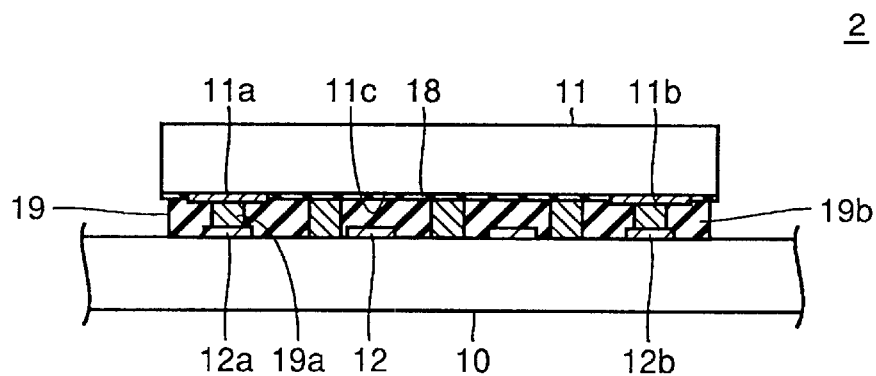
FIG. 3 is a cross sectional view taken along the line A—A of the IC card of the second embodiment shown in FIG. 1.

As shown in FIGS. 1 and 3, a non-contact IC card 2 according to the second embodiment is different from IC card 1 according to the first embodiment in that an insulating film 18 is formed on main surface 11c of IC chip 11 and IC chip 11 and substrate 10 are connected by an anisotropic conducting adhesive film 19 as a composite material.

Insulating film 18 covers a portion of main surface 11c on which terminals 11a and 11b are not formed. Anisotropic conducting adhesive film 19 is provided to be in contact with insulating film 18. Anisotropic conducting adhesive film 19 has an insulating portion 19b as an insulator and a conductive portion 19a as a conductor formed in insulating portion 19b in one direction. Coil outer end 12a and terminal 11a are electrically connected by conductive portion 19a. Coil inner end 12b and terminal 11b are electrically connected by conductive portion 19a.

Anisotropic conducting adhesive film 19 is conductive only in a direction of thickness (in a direction parallel with a sheet of FIG. 3). Although conductive portion 19a is in contact with coil 12 at portions other than coil outer end 12a and coil inner end 12b, since insulating film 18 is formed on main surface 11c of IC chip 11, the portion of coil 12 other than coil outer end 12a and coil inner end 12b is not electrically connected to IC chip 11. In addition, interconnections 13a, 13b, 15a and 15b are electrically connected to terminals 11h, 11i, 11j and 11k of IC chip 11 by anisotropic conducting adhesive film 19.

Figure 4:
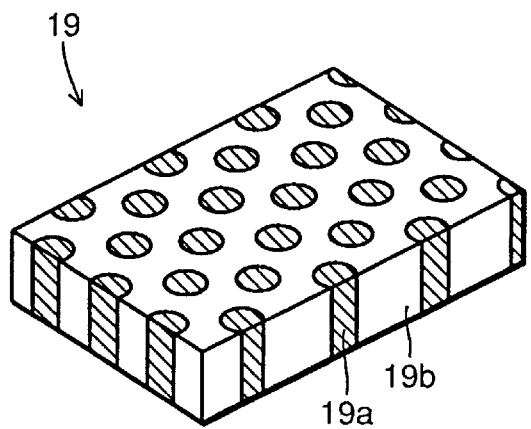
FIG. 4 is a perspective view showing a composite material according to the second embodiment.

Referring to FIG. 4, anisotropic conducting adhesive film 19 includes conductive portion 19a and insulating portion 19b surrounding conductive portion 19a and having a stickiness. Insulating portion 19b includes a soft resin or rubber material having a stickiness and an insulating property. Conductive portion 19a is obtained by mixing powder of a conductive material, such as metal or carbon, with a material similar to that of insulating portion 19b, and shaping it into a very thin fiber form. A plurality of conductive portions 19a are formed spaced apart in the direction of thickness.

The IC card having the above described structure produces an effect similar to that of IC card 1 described in the first embodiment. Further, as IC chip 11 is in contact with anisotropic conducting adhesive film 19 over a large area and anisotropic conducting adhesive film 19 is also in contact with substrate 10 over a large area, it is ensured that IC chip 11 is fixed to substrate 10.

Third Embodiment

Figure 5:
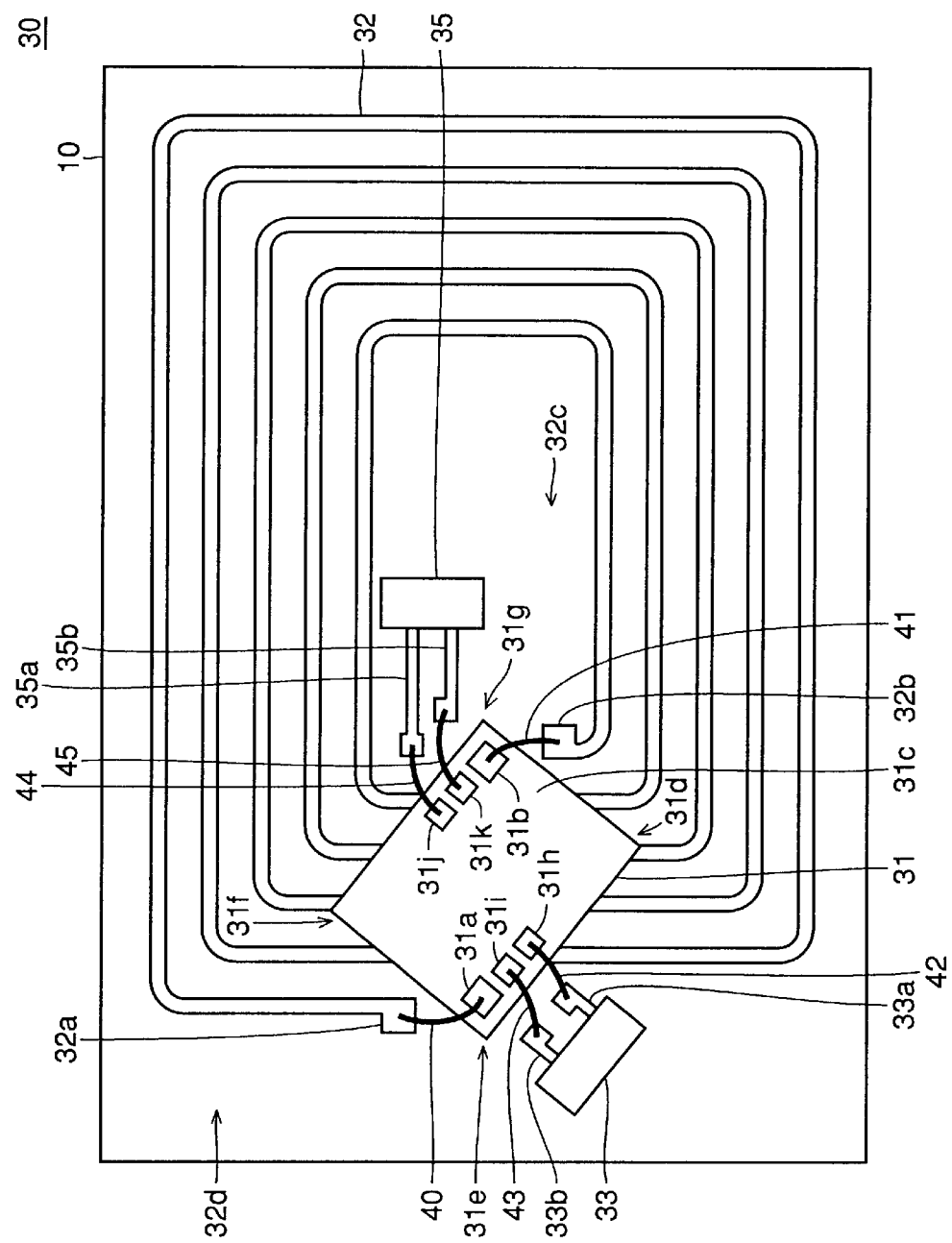
FIG. 5 is a plan view showing an IC card according to the third embodiment of the present invention.

Referring to FIG. 5, in a non-contact IC card 30 according to the third embodiment of the present invention, one tuning circuit transmits information and receives electric power. IC card 30 includes: substrate 10; a coil 32 as an antenna receiving an RF carrier transmitted by an external apparatus and provided on substrate 10; a non-contact IC chip 31 as a semiconductor device provided above substrate 10 and coil 32 and electrically connected to coil 32; and capacitors 33 and 35 electrically connected to IC chip 31.

Spirally wound coil 32 includes a conductor. Coil 32 has a coil outer end 32a and a coil inner end 32b. IC chip 31 as a semiconductor device is provided above substrate 10 and coil 32.

IC chip 31 has a main surface 31c. A surface opposite to main surface 31c faces substrate 10. Main surface 31c has four corners 31d, 31e, 31f and 31g. Corner 31g as the first corner and corner 31e as the second corner are spaced by a distance on an imaginary diagonal line of main surface 31c. The imaginary diagonal line connecting corners 31g and 31e and the direction in which coil 32 extends below IC chip 31 are orthogonal to each other. A terminal 31b as the first terminal is formed at first corner 31g. A terminal 31a as the second terminal is formed at second corner 31e. Terminals 31h, 31i, 31j and 31k are formed on main surface 31c.

Terminal 31a is positioned above and in vicinity of coil outer end 32a. Terminal 31a and coil outer end 32a are electrically connected by a bonding wire 40.

Terminal 31b is positioned above and in vicinity of coil inner end 32b. Terminal 31b and coil inner end 32b are electrically connected by a bonding wire 41.

A capacitor 33 for resonance is provided above substrate 10 and on the outer side 32d of the coil. Capacitor 33 is electrically connected to terminals 31h and 31i of IC chip 31 by bonding wires 42 and 43 and interconnections 33a and 33b.

A capacitor 35 for storing (smoothing) electric power is formed above substrate 10 and on the inner side 32c of the coil. Capacitor 35 is electrically connected to terminals 31j and 31k of IC chip 31 by bonding wires 49 and 45 and interconnections 35a and 35b.

As IC card 30 having the above described structure does not have a contact hole, the manufacturing process is not complicated. In addition, as the contact hole is not formed, the problem associated with breakage of a conducting line in the contact hole is not caused. Terminal 31a is provided in vicinity of coil outer end 32a and terminal 31b is provided in vicinity of coil inner end 32b, so that terminal 31a and coil outer end 32a can be electrically connected by a short bonding wire 40 and terminal 31b and coil inner end 32b can be electrically connected by short bonding wire 41. Consequently, it is unlikely that bonding wires 40 and 41 are brought into contact with the portion of coil 32 other than coil outer end 32a and coil inner end 32b, so that the problem associated with a short-circuit or the like is not caused. In addition, as bonding wires 40 and 41 are short, breakage thereof is not caused even if the external force is applied. As a result, malfunction is prevented. Further, as the imaginary diagonal line connecting corners 31g and 31e and the direction in which coils 32 extend below IC chip 31 are orthogonal to each other, a number of coils 32 can be provided between terminals 31a and 31b. In other words, such structure allows increase in the number of turns of the coil and transmission distance of the RF carrier. It is noted that capacitors 33 and 35 and chip 31 may be connected only by bonding wires 42, 43, 44, and 45 without using interconnections 33a, 33b, 35a and 35b.

Fourth Embodiment

Figure 6:
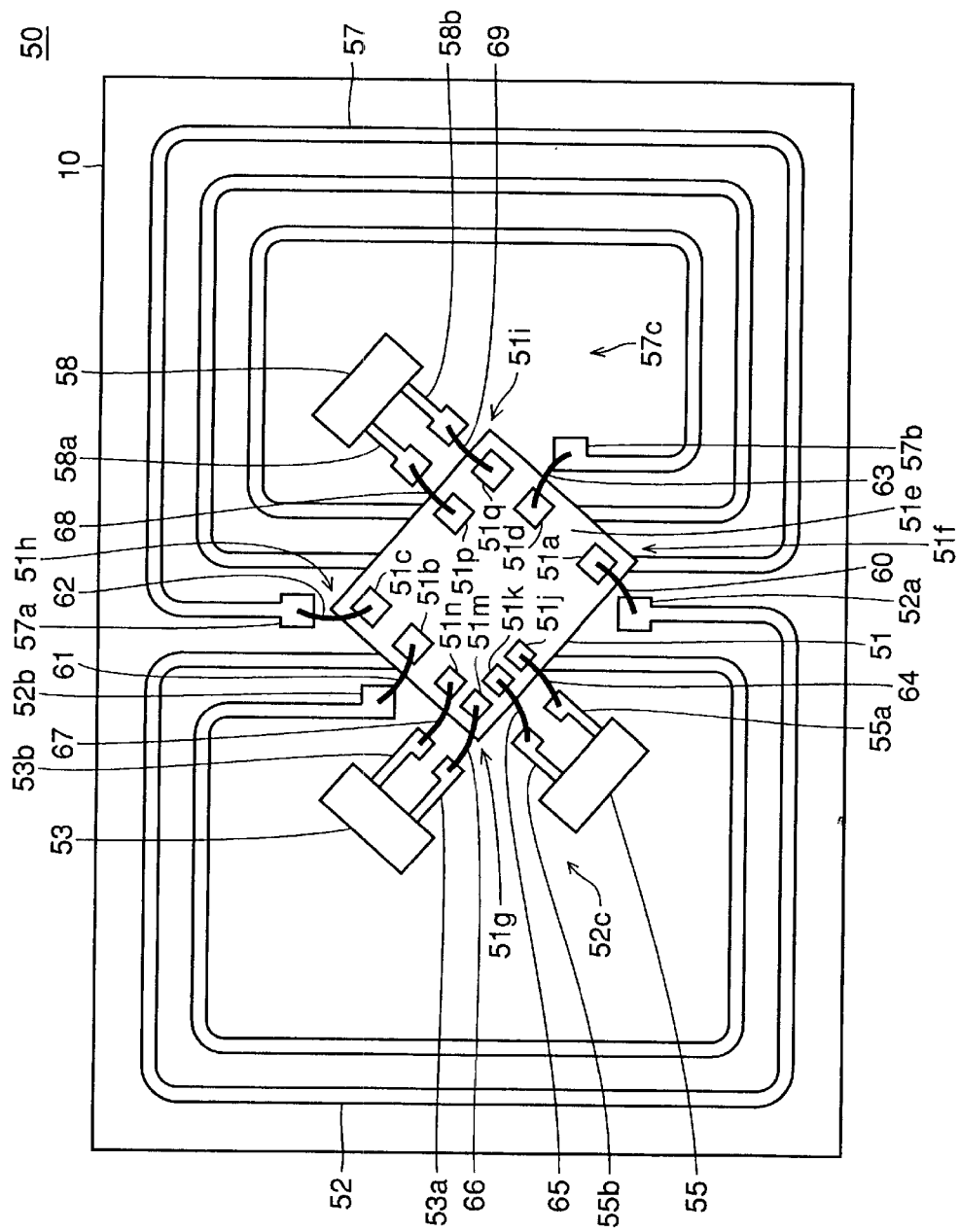
FIG. 6 is a plan view showing an IC card according to the fourth embodiment of the present invention.
Figure 7:
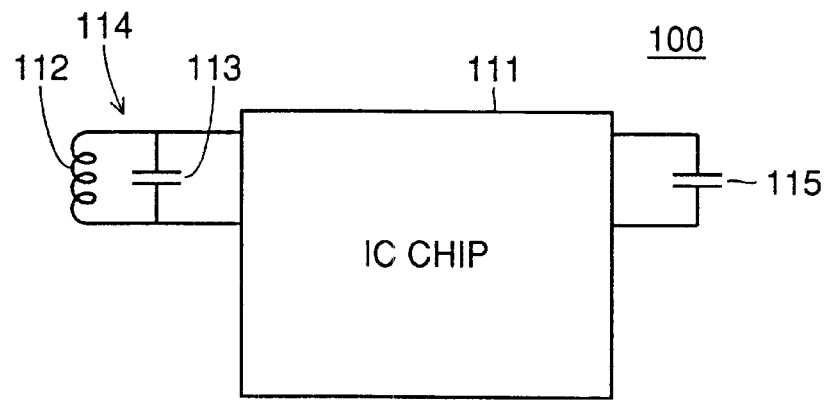
FIG. 7 is a schematic diagram showing an IC card having one tuning circuit.
Figure 8:
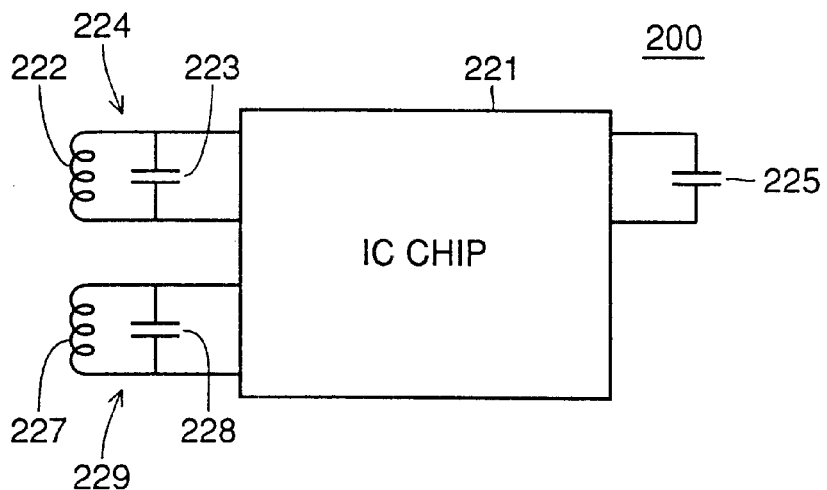
FIG. 8 is a schematic diagram showing an IC card having two tuning circuits.
Figure 9:
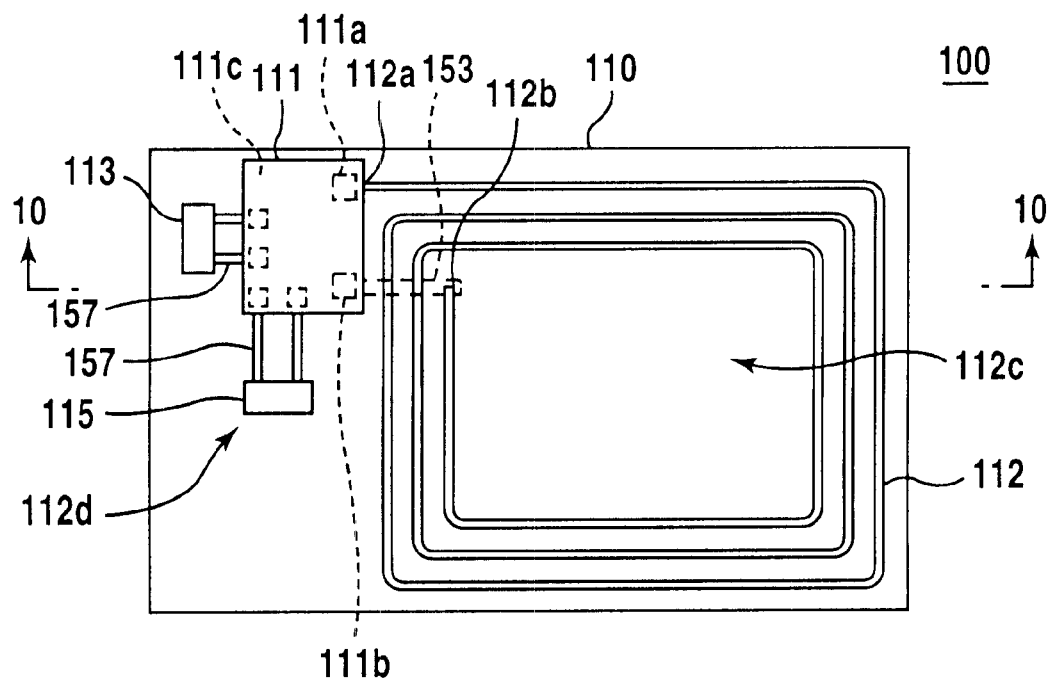
FIG. 9 is a plan view showing the IC card shown in FIG. 7.
Figure 10:
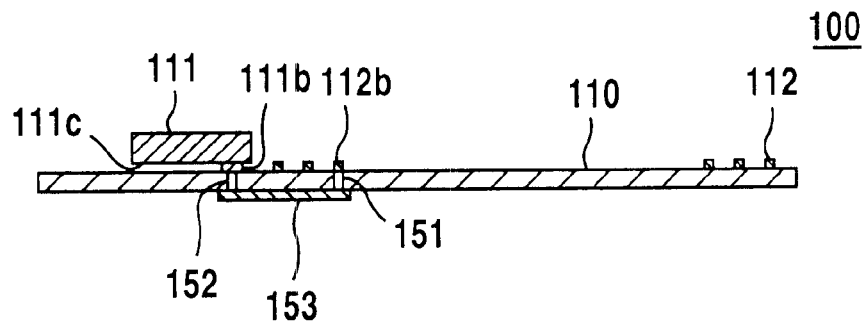
FIG. 10 is a cross sectional view taken along the line B—B in FIG. 9.

Referring to FIG. 6, in a non-contact IC card 50 according to the fourth embodiment of the present invention, one turning circuit transmits information and the other turning circuit receives electric power. IC card 50 includes: a substrate 10; coils 52 and 57 provided on substrate 10; an IC chip 51 provided above substrate 10 and coils 52 and 57 and electrically connected to coils 52 and 57; capacitors 53 and 58 for resonance; and a capacitor 55 for storing (smoothing) electric power.

Coil 52 as an antenna for receiving an RF carrier is formed on substrate 10. Coil 52 includes a spirally wound conductor. Coil 52 has a coil outer end 52a and coil inner end 52b.

Coil 57 as an antenna for receiving the RF carrier is formed on substrate 10. Coil 57 includes a spirally wound conductor. Coil 57 has a coil outer end 57a and a coil inner end 57b.

Coils 52 and 57 are wound in the same direction. Coils 52 and 57 are respectively used for transmission of information and electric power supply. In other words, if coil 52 is to receive information from the RF carrier transmitted by an external apparatus, coil 57 receives electric power from the RF carrier transmitted by the external apparatus. Conversely, coil 57 may receive information, whereas coil 52 receives electric power.

IC chip 51 as a semiconductor is formed above substrate 10 and coils 52 and 57. IC chip 51 has a main surface 51e. A surface opposite to main surface 51e faces substrate 10. Main surface 51e has four corners 51f, 51g, 51h and 51i. IC chip 51 is positioned such that an imaginary diagonal line connecting corners 51g and 51i and the direction in which coils 52 and 57 extend below IC chip 51 are orthogonal to each other.

A terminal 51a is formed at corner 51f. Terminal 51a is positioned above and in vicinity of coil outer end 52a. Coil outer end 52a and terminal 51 are electrically connected by a bonding wire 60.

A terminal 51b is provided between corners 51g and 51h. Terminal 51b is provided above and in vicinity of coil inner end 52b. Terminal 51b and coil inner end 52b are electrically connected by a bonding wire 61.

A terminal 51c is provided at corner 51h. Terminal 51c is positioned above and in vicinity of coil outer end 51a. Terminal 51c and coil outer end 57a are electrically connected by a bonding wire 62.

A terminal 51d is provided between corners 51i and 51f. Terminal 51d is positioned above and in vicinity of coil inner end 57b. Terminal 51d and coil inner end 57b are electrically connected by a bonding wire 63. Main surface 51e is provided with terminals 51j, 51k, 51m, 51n, 51p and 51q.

Capacitor 53 for resonance is provided on the inner side 52c of the coil. Capacitor 53 is electrically connected to terminals 51m and 51n of IC chip 51 by interconnections 53a and 53b and bonding wires 66 and 67. In addition, a capacitor 55 for storing (smoothing) electric power is provided on the inner side 52c of coil 52. Capacitor 55 is electrically connected to terminals 51j and 51k of IC chip 51 by interconnections 55a and 55b and bonding wires 64 and 65. A capacitor 58 for resonance is provided on the inner side 57c of the coil. Capacitor 58 is electrically connected to terminals 51p and 51q of IC chip 51 by bonding wires 68 and 69 and interconnections 58a and 58b.

In IC card 50 having the above described structure, a contact hole is not formed and a long bonding wire is not provided. Thus, the problem associated with the complicated manufacturing process or malfunction is not caused. Further, as the imaginary diagonal line connecting corners 51g and 51i and the direction in which coils 52 and 57 extend below IC chip 51 are orthogonal to each other, a number of conductive layers can be formed below IC chip 51 and two coils 52 and 57 may be provided.

Terminals 51b and 51d are provided between corners, that is, at the intermediate portion of the side of IC chip 51. This is because terminals 51m, 51n, 51p and 51q are provided at corners 51g and 51i to reduce the length of the bonding wire connecting capacitors 53 and 58 and terminals 51m, 51n, 51p and 51q. As described above, bonding wires 61 and 63 are reduced in length by arranging coil inner ends 52b and 57b in vicinity of terminals 51b and 51d even when terminals 51b and 51d are provided at the intermediate portion of the side.

It is noted that non-contact IC cards 1, 2, 30 and 50 according to the above described four embodiments are all produced by sandwiching the substrate having the IC chip, capacitor and the like with thin plates of resin. IC cards 1, 2, 30 and 50 are flexible and may be deflected by the external force. However, as a through hole is not formed in substrate 10, breakage of a conducting line in the through hole and connecting failure are prevented.

Instead of sandwiching substrate 10 with the thin plates of resin, the thin plate of resin per se may be used as a substrate, on which a coil, IC chip, capacitor and the like are provided, and then another thin plate of resin is applied thereto. In such a structure, an interconnection is not exposed as there is no through hole. Therefore, breakage of an interconnection by a friction is not caused.

The IC chip needs not necessarily reach the inner and outer sides of the coil. An IC chip which is smaller than a coil width (a width of the coil from the inner end to the outer end of the coil) may be provided above a coil. In this case, a surface opposite to that of the IC chip with the terminal faces the conductive layer as the IC chip is above the coil, and both ends of the coil and both ends of the IC chip are connected by bonding wires as described in the third and fourth embodiments. In this case, the length of the bonding wire can also be reduced.

In the above described embodiments, a coil is rectangular in shape and the capacitor is arranged on the inner side of the coil. However, the shape of the coil and the arrangement of the capacitor are not limited to this, and various shapes and arrangements may be employed. For example, the coil may be circular in shape. In addition, all capacitors may be arranged on the outer side of the coil.

INDUSTRIAL APPLICABILITY

The non-contact type IC card of the present invention is used as a card capable of verifying and updating data in a non-contact state with respect to an external data processing apparatus. More specifically, it is used for example as a pass of the ski lift, a commuter's pass for a train or bus, a tag for administration of inventory and the like.

What is claimed is:

1. A non-contact IC card, comprising:

a substrate;

a conductive layer provided above said substrate and forming a coil; and a semiconductor device electrically connected to said conductive layer and having a main surface, said semiconductor device having a first terminal and a second terminal formed on said main surface, said conductive layer having a coil inner end electrically connected to said first terminal and a coil outer end electrically connected to said second terminal, said semiconductor device being provided above said conductive layer such that said coil inner end is positioned in vicinity of said first terminal and said coil outer end is positioned in vicinity of said second terminal, said main surface of said semiconductor device having a first corner and a second corner, wherein said semiconductor device is configured on said conductive layer such that an imaginary line diagonally connecting said first corner and said second corner, and a direction in which said coil extends below said semiconductor device are orthogonal to each other.

2. The non-contact IC card according to claim 1, wherein said semiconductor device is provided above said conductive layer such that said first terminal is positioned above said coil inner end and said second terminal is positioned above said coil outer end.

3. The non-contact IC card according to claim 1, wherein said semiconductor device is positioned to cover a portion of said conductive layer.

4. The non-contact IC card according to claim 3, wherein said first terminal is formed at said first corner and said second terminal is formed at second corner.

5. The non-contact IC card according to claim 1, wherein said main surface of said semiconductor device having said first terminal and said second terminal faces said conductive layer.

6. The non-contact IC card according to claim 5, wherein said first terminal and said coil inner end are electrically connected by a solder, and said second terminal and said coil outer end are electrically connected by a solder.

7. The non-contact IC card according to claim 6, wherein each of said first terminal and said second terminal is in a bump shape.

8. The non-contact IC card according to claim 1, wherein a surface opposite to said main surface of said semiconductor device having said first terminal and said second terminal faces said conductive layer.

9. The non-contact IC card according to claim 8, wherein said first terminal and said coil inner end are electrically connected by a conducting line, and said second terminal and said coil outer end are electrically connected by a conducting line.

10. The non-contact IC card according to claim 1, wherein said semiconductor device and said coil inner end of said conductive layer are electrically connected by a composite material including an insulator having a plurality of conductors in one direction, and semiconductor device and said coil outer end of said conductive layer are electrically connected by said composite material.

11. The non-contact IC card according to claim 1, further composing a capacitor provided above said substrate and connected to said semiconductor device.

12. The non-contact IC card according to claim 1, wherein said conductive layer forms a plurality of coils.

* * * * *